(12) United States Patent
Inada et al.

(10) Patent No.: US 9,264,645 B2
(45) Date of Patent: Feb. 16, 2016

(54) OPTICAL SENSOR APPARATUS

(71) Applicant: SUMITOMO ELECTRIC INDUSTRIES, LTD., Osaka-shi, Osaka (JP)

(72) Inventors: Hiroshi Inada, Sakai (JP); Masaki Migita, Fujisawa (JP); Yasuhiro Iguchi, Yokohama (JP)

(73) Assignee: SUMITOMO ELECTRIC INDUSTRIES, INC., Osaka (JP)

( * ) Notice: Subject to any disclaimer, the term of this patent is extended or adjusted under 35 U.S.C. 154(b) by 0 days.

(21) Appl. No.: 14/448,311

(22) Filed: Jul. 31, 2014

(65) Prior Publication Data

US 2015/0035989 A1    Feb. 5, 2015

(30) Foreign Application Priority Data

Aug. 2, 2013   (JP) ................ P2013-161676

(51) Int. Cl.
*H04N 5/378*    (2011.01)
*H04N 5/33*     (2006.01)
*H04N 5/361*    (2011.01)
*H04N 5/225*    (2006.01)

(52) U.S. Cl.
CPC .............. *H04N 5/378* (2013.01); *H04N 5/2257* (2013.01); *H04N 5/33* (2013.01); *H04N 5/361* (2013.01); *H01L 2224/16145* (2013.01); *H01L 2224/48091* (2013.01); *H01L 2224/73257* (2013.01)

(58) Field of Classification Search
CPC ......... H04N 5/378; H04N 5/33; H04N 5/361; H04N 5/2257
USPC ................... 250/239; 257/737–738
See application file for complete search history.

(56) References Cited

U.S. PATENT DOCUMENTS

| | | | |
|---|---|---|---|
| 9,123,605 B2 * | 9/2015 | Iguchi | H01L 27/14618 |
| 2012/0032145 A1 * | 2/2012 | Nagai | H01L 24/11 |
| | | | 257/14 |
| 2014/0362268 A1 * | 12/2014 | Etoh | H04N 5/3696 |
| | | | 348/306 |
| 2014/0367818 A1 * | 12/2014 | Iguchi | H01L 27/14618 |
| | | | 257/432 |

FOREIGN PATENT DOCUMENTS

| | | |
|---|---|---|
| JP | 06-302845 | 10/1994 |
| JP | 2003-163938 | 6/2003 |
| JP | 2013-041922 | 2/2013 |

OTHER PUBLICATIONS

Yasuhiro Iguchi, et al *"Two-Dimensional Near Infrared Sensor with Low Noise and Wide Wavelength Range"*, SEI Technical Review, No. 76, Apr. 2013, pp. 98-101.

* cited by examiner

*Primary Examiner* — Seung C Sohn
(74) *Attorney, Agent, or Firm* — Smith, Gambrell & Russell LLP (57) ABSTRACT

An optical sensor apparatus includes a package having a window; a sensor chip having an array of light receiving devices and a pixel electrode connected to each light receiving device, the sensor chip having an incidence surface that faces the window of the package; and a read-out circuit disposed under the sensor chip, the read-out circuit having a read-out electrode electrically connected to each pixel electrode of the sensor chip. The sensor chip and the read-out circuit are housed in the package. In plan view from the sensor chip, the read-out circuit is overlapped by the sensor chip, and the read-out circuit has no portion extending off the sensor chip.

10 Claims, 7 Drawing Sheets

OPTICAL SENSOR APPARATUS

BACKGROUND OF THE INVENTION

1. Field of the Invention

The present invention relates to an optical sensor apparatus, and specifically relates to an optical sensor apparatus capable of obtaining high-quality images.

2. Description of the Related Art

The optical sensor apparatus has been used for solid-state image sensing devices which have a sensitivity for visible light. Recently, Life science-related field is increasingly attracting attention. Life science-related objects, such as drugs, foods, and living bodies, absorb light of an infrared wavelength range of approximately 1 µm to 3 µm. As the technology in the life science field is developed, the use of an infrared optical sensor apparatus has become widespread. The infrared optical sensor apparatus is usually cooled to, for example, liquid-nitrogen temperature during operation. With improvements in semiconductor technology, the infrared optical sensor apparatus has sufficiently high image quality, even if the infrared optical sensor apparatus is cooled by using thermoelectric device such as a Peltier device. In addition, the infrared optical sensor apparatus has become smaller in size. For example, "Two-Dimensional Near Infrared Sensor with Low Noise and Wide Wavelength Range", SEI TECHNICAL REVIEW, NUMBER 76, pp. 98-101, APRIL (2013) by Yasuhiro IGUCHI et al. discloses an infrared image sensor that combines an infrared light receiving device (sensor chip) having a two-dimensional array of pixels with a complementary metal oxide semiconductor (CMOS device) device forming a read-out circuit (read-out integrated circuit (ROIC)). In this infrared image sensor, the sensor chip is flip-chip connected through indium bumps to the CMOS device. This sensor chip is mounted on a ceramic package together with a Peltier device. A photocurrent generated in each pixel of the sensor chip is output as a voltage through a capacitive transimpedance amplifier (CTIA) in the read-out circuit, processed by an external field-programmable gate array (FPGA), and then output as a digital signal.

Optical sensor apparatuses, including those for the visible range, have been developed for better image quality. For example, Patent Document 1 (Japanese Unexamined Patent Application Publication No. 6-302845) proposes an anti-reflection coating that absorbs reflected light to suppress noise light produced in the light receiving regions (pixels) of a solid-state image sensing device for visible light. Specifically, the proposed anti-reflection coating has a textured surface. Also, Patent Document 2 (Japanese Unexamined Patent Application Publication No. 2003-163938) proposes a structure that provides a partition for each pixel unit to suppress crosstalk caused by scattered light.

Furthermore, Patent Document 3 (Japanese Unexamined Patent Application Publication No. 2013-41922) describes a problem related to image quality of an infrared image sensor. In this problem, a light receiving device malfunctions due to infrared light entering through through-holes formed in a wiring board. As a solution to this, a light receiving apparatus is proposed, in which the through-holes are filled with resin that transmits visible light and blocks infrared light.

SUMMARY OF THE INVENTION

The optical sensor apparatus is contained in a package having a window. In the infrared optical sensor apparatus, high performances such as a low dark current and a high-resolution image are obtained by cooling the infrared optical sensor apparatus using, for example, a Peltier device.

In a conventional optical sensor apparatus, read-out signals are taken out from external connection terminals (pad electrodes) on the read-out circuit. One end of a wire is connected by wire bonding to each external connection terminal on the read-out circuit. The other end of this wire is connected to a part of each interconnection electrode on a relay board. One end of another wire is connected to the remaining part of the interconnection electrode, and the other end of this wire is connected to a connecting pin formed in the package main body. For the wire bonding connection described above, the external connection terminals on the read-out circuit need to be arranged in an area extending off the sensor chip in plan view. In other words, for arrangement of the external connection terminals, the read-out circuit needs to have an area extending off the sensor chip.

However, it is found that the optical sensor apparatus of this type has phenomena (problems) that deteriorate image quality. For example, when white light of a halogen lamp is applied to a flat plate and the reflected light is made incident on the optical sensor apparatus, an image with a uniform intensity distribution over the entire rectangular screen should be obtained. In practice, however, undulations of light and dark appear at edge portions along vertical sides (short sides) of the rectangular screen. Additionally, a hand-like light portion and dark portions by which the band-like light portion is sandwiched from above and below appear in a direction parallel to horizontal sides (long sides) of the rectangular screen. The uneven distribution of light and dark in an image appears at the periphery of the screen. Such phenomena seriously degrade the image quality and damage the commercial value of the optical sensor apparatus.

Causes of the phenomena have been examined. An anti-reflection (AR) coating is formed on an incidence surface of the sensor chip. Most of light entering through the window of the package is incident on a pixel region of the sensor chip. The window of the package is sized to be larger than the incidence surface of the sensor chip to allow more space. Therefore, light entering through the window of the package passes outside the sensor chip and reaches the surrounding portions of the read-out circuit and the external connection terminals. Then the light is reflected by the surrounding portions of the read-out circuit and the external connection terminals which extend off the sensor chip, and reaches the back surface of the window. The light is further reflected from the back surface of the window and returns to the sensor chip. The light reflected from the surrounding portions of the read-out circuit and the external connection terminals may cause the uneven distribution of light and dark in an image at the periphery of the screen. The reason why the uneven distribution of light and dark in an image appears at the periphery of the screen is because the light reflected by the surrounding portions of the read-out circuit is further reflected by the back surface of the window and returns to the periphery of the pixel region of the sensor chip. The anti-reflection (AR) coating is formed on the incidence surface of the sensor chip. Therefore, when the reflected light reaches to the incidence surface of the sensor chip, the reflected light is not further reflected at the incidence surface of the sensor chip.

An optical sensor apparatus according to an aspect of the present invention includes a package having a window; a sensor chip having an array of light receiving devices and a pixel electrode connected to the light receiving device, the sensor chip having an incidence surface that faces the window of the package; and a read-out circuit disposed under the sensor chip, the read-out circuit having a read-out electrode electrically connected to the pixel electrode of the sensor chip. The sensor chip and the read-out circuit are housed in the package. In plan view from the sensor chip, the read-out circuit is overlapped with the sensor chip, and the read-out circuit has no portion extending off the sensor chip.

In the optical sensor apparatus according to the present invention, in plan view from the sensor chip, the read-out circuit is hidden by the sensor chip and has no portion extending off the sensor chip. Therefore, it is possible to eliminate reflection from the read-out circuit. As a result, a uniform light intensity distribution on an image surface is achieved. The optical sensor apparatus having high image quality is obtained.

In the optical sensor apparatus according to the aspect of the present invention, the pixel electrode of the sensor chip and the read-out electrode of the read-out circuit may be electrically connected by flip-chip connection to each other through a bump.

The optical sensor apparatus according to the aspect of the present invention may further include an underfill resin filled in a space between the bumps interposed between the pixel electrodes of the sensor chip and the read-out electrodes of the read-out circuit. The underfill resin preferably has an outer periphery extending outward from the read-out circuit to the sensor chip in a skirt-like manner. In the optical sensor apparatus according to the present invention, the sensor chip is two-dimensionally larger in size or shape than the read-out circuit. Therefore, the outer periphery of the underfill resin extends outward from the read-out circuit to the sensor chip in a skirt-like manner.

The optical sensor apparatus according to the aspect of the present invention may further include a relay board under the read-out circuit, the relay board having an interconnection electrode. The read-out circuit preferably has an external connection terminal on a surface thereof and a via hole directly below the external connection terminal. The external connection terminal is preferably connected to the read-out electrode of the read-out circuit. The via hole is preferably filled with a conductive material. The relay board may have, in plan view from the sensor chip, a region overlapped with the read-out circuit and a region extending off the sensor chip. The interconnection electrode is preferably extended from the region overlapped with the read-out circuit to the region extending off the sensor chip. In addition, the external connection terminal and the interconnection electrode may be electrically connected through the conductive material in the via hole of the read-out circuit.

In the optical sensor apparatus described above, the external connection terminal on the read-out circuit is hidden by the sensor chip. Therefore, it is difficult to connect the external connection terminal to the interconnection electrode of the relay board disposed under the read-out circuit. However, the read-out circuit has the via hole directly below the external connection terminal. The via hole is filled with the conductive material. The external connection terminal is electrically connected to the interconnection electrode of the relay board through the conductive material filled in the via hole.

In the optical sensor apparatus according to the aspect of the present invention, the package preferably includes a package main body having a connection pin. The interconnection electrode of the relay board may be electrically connected to the connection pin of the package main body.

In the optical sensor apparatus, each of the interconnection electrodes of the relay board is wire-bonded to the connection pin formed at the package main body. This enables transmission of read-out signals to the outside.

In the optical sensor apparatus according to the aspect of the present invention, the read-out circuit may have an external connection terminal on a surface thereof. The external connection terminal is preferably connected to the read-out electrode of the read-out circuit. The sensor chip may have a through-hole filled with a conductive material, and a pad electrode on the incidence surface opposite to a surface on which the pixel electrode is formed. In addition, the external connection terminal and the pad electrode may be electrically connected through the conductive material filled in the through-hole.

In the optical sensor apparatus described above, the sensor chip has the through-hole filled with a conductive material, and the pad electrode on the incidence surface thereof. The external connection terminal is electrically connected to the pad electrode through the conductive material filled in the through-hole.

The optical sensor apparatus according to the aspect of the present invention may further include a relay board under the read-out circuit, the relay board having an interconnection electrode in a region extending off the sensor chip in plan view from the sensor chip. The interconnection electrode of the relay board may be electrically connected to the pad electrode through a wire.

In the optical sensor apparatus according to the aspect of the present invention, the package preferably includes a package main body having a connection pin. The pad electrode on the incidence surface of the sensor chip may be electrically connected to the connection pin of the package main body through a wire. In the optical sensor apparatus, the pad electrode on the sensor chip is wire-bonded to the connection pin of the package main body. In this case, the relay board is basically not necessary.

In the optical sensor apparatus according to the aspect of the present invention, the read-out circuit may have an external connection terminal on a surface thereof. The external connection terminal is preferably connected to the read-out electrode of the read-out circuit. The sensor chip may have a wiring pattern and a pad electrode on the incidence surface opposite to a surface on which the pixel electrode is formed. The wiring pattern is preferably formed along an outer periphery of the sensor chip on the incidence surface, a side surface, and the surface on which the pixel electrode is formed. In addition, the external connection terminal and the pad electrode may be electrically connected through the wiring pattern.

In the optical sensor apparatus described above, the sensor chip has the wiring pattern and the pad electrode on the incidence surface thereof. The wiring pattern is formed along the outer periphery of the sensor chip on the incidence surface, the side surface, and the surface on which the pixel electrode is formed. The external connection terminal is electrically connected to the pad electrode through the wiring pattern.

DESCRIPTION OF THE PREFERRED EMBODIMENTS

Embodiments of an optical sensor apparatus according to the present invention will be described with reference to the attached drawings. Where possible, the same parts are given the same reference numerals.

First Embodiment

An optical sensor apparatus according to an embodiment will now be described. In the embodiment, an optical sensor apparatus includes a sensor chip (or a light receiving device), a read-out circuit connected to the sensor chip, and a package having a window. A bottom of the package is located at the opposite side of the window. The sensor chip and the readout circuit are housed in the package. An incidence surface of the sensor chip faces the window of the package. Read-out electrodes are disposed under the sensor chip. A relay board is disposed under the read-out electrodes. In the optical sensor apparatus having a sensitivity in an infrared wavelength region (hereinafter referred to as "infrared optical sensor apparatus"), the relay board is disposed on a Peltier device. The Peltier device is disposed on the bottom of the package. A package main body of the package is made of sintered ceramic for heat insulation. That is, the sensor chip (light receiving device), a read-out circuit, the relay board, and the Peltier device are disposed in this order from the upper side in the package. Pixel electrodes of the sensor chip (light receiving device) are flip-chip connected through bumps to read-out electrodes of the read-out circuit.

In the following description, an incidence surface side of the sensor chip may be referred to as an upper side. A direction from the incidence surface side of the sensor chip to the read-out circuit may be referred to as a downward direction.

Figure 1:
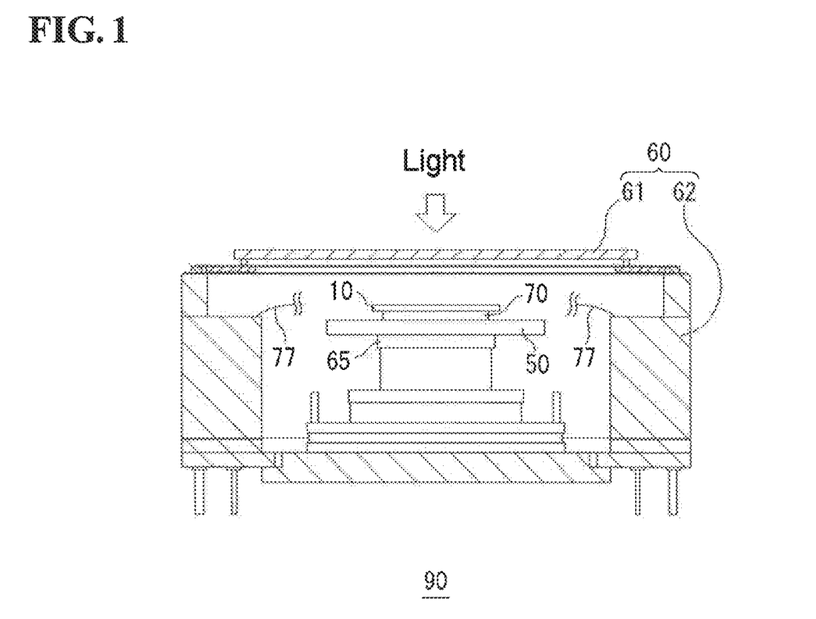
FIG. 1 illustrates an optical sensor apparatus according to a first embodiment of the present invention.

FIG. 1 is a schematic view of an infrared optical sensor apparatus 90 according to a first embodiment of the present invention. In the infrared optical sensor apparatus 90 illustrated in FIG. 1, a sensor chip 10, a read-out circuit 70, a relay board 50, and a Peltier device 65 are contained in a package 60. The package 60 is made by combining a window 61 with a box-like package main body 62. Since the package 60 may be cooled to a low temperature by using the Peltier device 65 and subjected to a negative pressure, an inert gas, such as nitrogen gas or argon gas, may be sealed in the package 60. A surface of the sensor chip 10 facing the window 61 (typically a back surface of a semiconductor substrate) is provided with an anti-reflection (AR) coating. The AR coating is made of a dielectric film such as SiON, SiN, $Al_2O_3$, and $TiO_2$. The sensor chip 10 includes a planar-type light receiving device that has a type-II InGaAs/GaAsSb multi quantum well (MQW) structure formed on an InP substrate as an optical absorption layer, so as to have a sensitivity even in a near-infrared long wavelength region (see FIG. 9).

The read-out circuit (ROIC) 70 is normally formed on a silicon (Si) substrate. For example, a CMOS device may be used as the read-out circuit. The sensor chip 10 is formed on a III-V group semiconductor substrate, such as an InP substrate. The read-out circuit 70 is formed on a Si substrate. Therefore, a combination of the sensor chip 10 and the read-out circuit 70 may be called a hybrid semiconductor. The read-out electrodes 71 of the read-out circuit (CMOS device) 70 and the pixel electrodes 11 of the sensor chip 10 are connected to each other through bumps 79 made of indium or the like.

Electric signals generated from respective pixels of the sensor chip 10 are read out by the read-out electrodes 71 of the CMOS device 70. To take out output signals from the CMOS device 70, wires 77 made of gold (Au) or aluminum (Al) are connected to output pins (not shown) on the package main body 62. For the wire bonding, external connection terminals 75 are formed on the CMOS device 70. The external connection terminals 75 are connected to the read-out electrodes 71 of the CMOS device 70. As described above, light reflected from the top surface of the CMOS device 70 and the external connection terminals 75 is further reflected from the back surface of the window 61 and reaches the incidence surface of the sensor chip 10. When the light reflected from the top surface of the CMOS device 70 and the external connection terminals 75 is incident on the incidence surface of the sensor chip 10, nonuniformity in the sensitivity of the sensor chip 10 occurs in an image surface. Particularly, undulations of light and dark appear along short sides of the rectangular image surface. Additionally, a band-like pattern similar to the arrangement of the external connection terminals 75 on the CMOS device 70 appears on the image surface.

Figure 2:
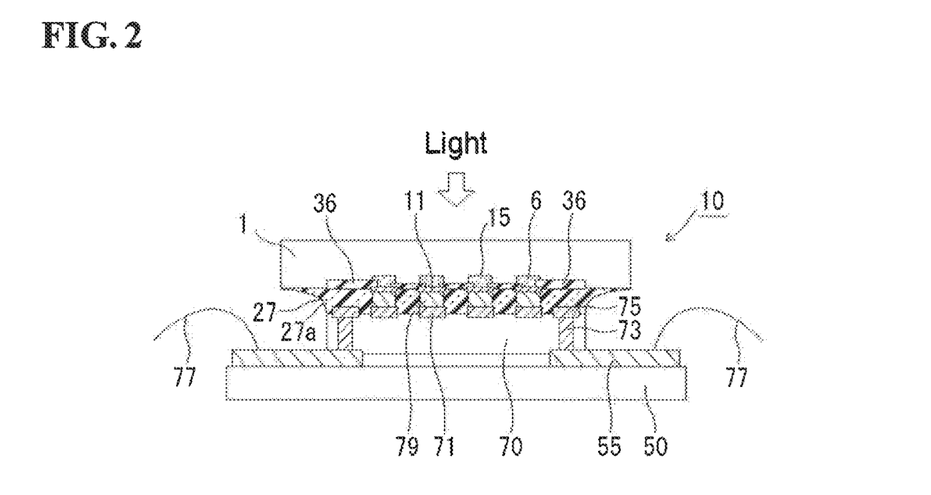
FIG. 2 illustrates a sensor chip, a read-out circuit, and other components of the optical sensor apparatus illustrated in FIG. 1.

In the optical sensor apparatuses of the first and second embodiments, as illustrated in FIGS. 1 to 6, the sensor chip 10 is two-dimensionally larger than the read-out circuit 70. This means that in plan view from the sensor chip 10, the read-out circuit 70 is overlapped with the sensor chip 10 and has no portion extending off the sensor chip 10. In plan view from the sensor chip 10, the read-out circuit 70 is hidden by the sensor chip 10. Accordingly, as illustrated in FIG. 2, an underfill resin 27 disposed to fill spaces between the bumps 79 for connection between the pixel electrode 11 of the sensor chip 10 and the read-out electrode 71 of the read-out circuit 70 has the following distinctive configuration. That is, an outer periphery 27a of the underfill resin 27 extends outward from the read-out circuit 70 to the sensor chip 10 in a skirt-like manner. In a conventional optical sensor apparatus, a sensor chip is smaller than a read-out circuit in size or shape. In this case, an outer periphery of underfill resin extends oppositely from the sensor chip to the read-out circuit in a skirt-like manner. The shape of the outer periphery 27a of the underfill resin 27 in the present embodiment is obtained collaterally as a result of the fact that the sensor chip 10 is larger than the read-out circuit 70. That is, the shape of the outer periphery 27a of the underfill resin 27 is obtained because the underfill resin 27 is injected with the sensor chip 10 (which is larger) down and the read-out circuit 70 up. A silica-containing epoxy resin is used as the underfill resin 27. This is for the following reason. The optical sensor apparatus is cooled to a temperature lower than the room temperature during operation, and warmed back to the room temperature when not in use. This thermal cycle between the low temperature and the room temperature causes, for example, indium (In) bumps to peel off. Because of the thermal expansion coefficient and strength, using an epoxy resin can prevent peeling of indium (In) bumps caused by the thermal cycle.

Figure 3:
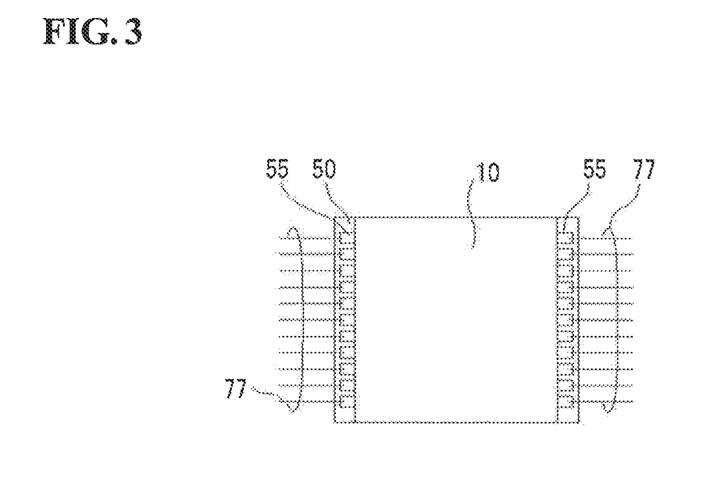
FIG. 3 is a plan view of FIG. 2 as viewed from the sensor chip.

An electrical connection path illustrated in FIGS. 2 and 3 will now be described. In the optical sensor apparatus illustrated in FIGS. 2 and 3, the read-out circuit 70 is hidden by the sensor chip 10 in plan view from the sensor chip 10. This means that the external connection terminals 75 for transmitting read-out signals to the outside are also hidden from view, and wire bonding to the external connection terminals 75 cannot be made. As described above, the external connection terminals 75 is connected to the read-out electrodes 71 of the read-out circuit (CMOS device) 70. Another electrical path needs to be formed for wire bonding to connection pins on the package main body 62. Therefore, an electrical path for transmitting signals to the outside needs to be provided. In the present embodiment, the relay board 50 is disposed under the read-out circuit 70. The relay board 50 is larger than the read-out circuit 70 and the sensor chip 10. Therefore, the relay board 50 has, in plan view from the sensor chip, a region overlapped with the read-out circuit 70 and a region extending off the sensor chip 10. On the relay board 50, interconnection electrodes 55 extending from the region overlapped with the read-out circuit 70 to the region extending of the sensor chip 10 are formed. In addition, via holes are provided in the read-out circuit 70 at a portion directly below the external connection terminals 75 on the read-out circuit 70. The via holes are filled with a conductive material 73 for conductive connection to the interconnection electrodes 55 on the relay board 50. The external connection terminals 75 and the interconnection electrodes 55 are aligned with each other. The via holes are disposed on the interconnection electrodes 55, and the conductive material 73 in the via holes is in contact with the external connection terminals 75 and the interconnection electrodes 55. The interconnection electrodes 55 are connected by wire bonding to the respective connection pins on the package main body 62, so that signals can be transmitted to the outside. Many wires 77 are bonded as illustrated in FIG. 3, but they are of a single type.

Second Embodiment

Figure 4:
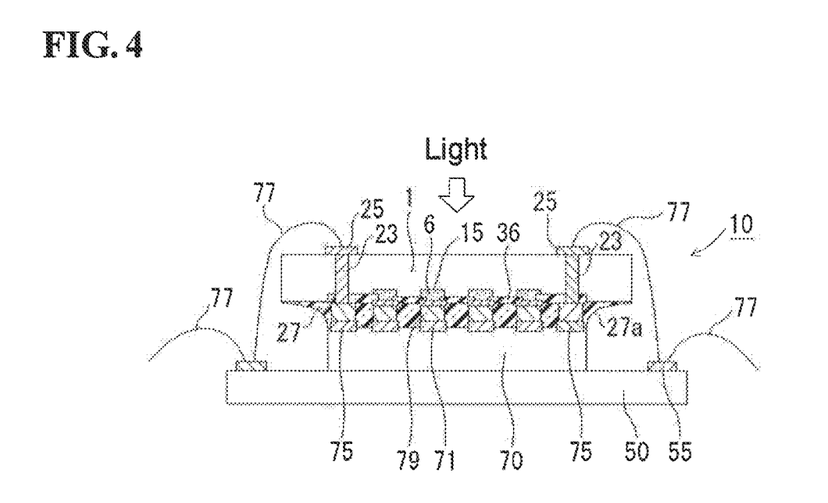
FIG. 4 illustrates the sensor chip, the read-out circuit, and other components in a second embodiment of the present invention.
Figure 5:
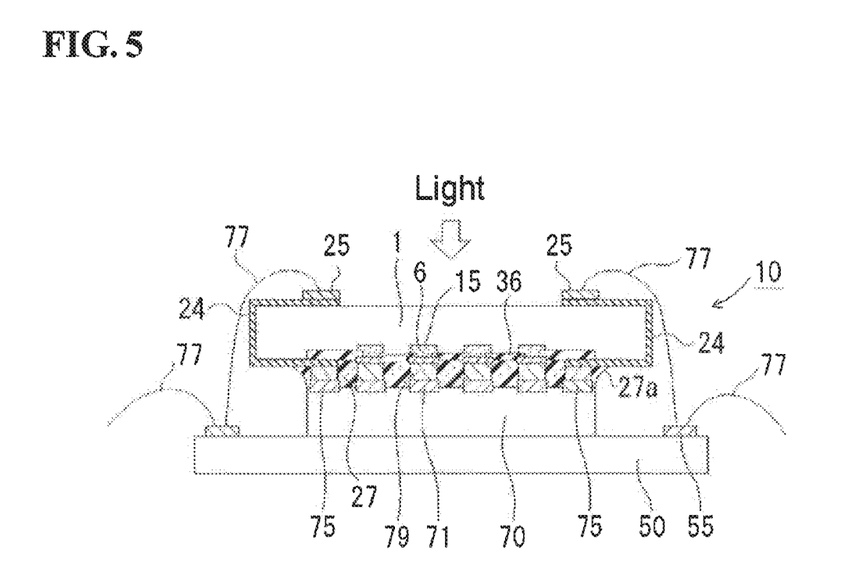
FIG. 5 illustrates a modification of the optical sensor apparatus illustrated in FIG. 4.

FIG. 4 illustrates a main part of an optical sensor apparatus according to a second embodiment of the present invention. In the optical sensor apparatus illustrated in FIG. 4, the sensor chip 10 has a through-hole passing through the sensor chip 10 and a pad electrode 25 formed on the incidence surface. In the through-hole, a conductive material 23 is filled. The external connection terminals 75 on the read-out circuit 70 are electrically connected to the pad electrodes 25 on the incidence surface of the sensor chip 10 through the bumps 79 and the conductive materials 23 filled in the through-holes, respectively. The conductive materials 23 with which the through-holes are filled and the external connection terminals 75 are positioned directly below the pad electrodes 25. The bumps 79 are disposed between the external connection terminals 75 and the conductive materials 23. The conductive connection between the pad electrodes 25 and the external connection terminals 75 may be made through any wiring path. For example, the pad electrodes 25 and the external connection terminals 75 may be electrically connected through wiring patterns or metal lines formed on the incidence surface, a side surface, and a surface opposite to the incidence surface along an outer periphery of the sensor chip 10 as shown in FIG. 5. On the surface opposite to the incidence surface of the sensor chip 10, the pixel electrodes 11 are formed. The pad electrodes 25 on the sensor chip 10 are connected through the wires 77 to the interconnection electrodes 55 on the relay board 50. Further connection from the interconnection electrodes 55 is the same as that in the optical sensor apparatus illustrated in FIG. 2. There are two types of wire bonding in this case: one that connects the pad electrodes 25 to the interconnection electrodes 55, and the other that connects the interconnection electrodes 55 to the connection pins (not shown).

Modification

Figure 6:
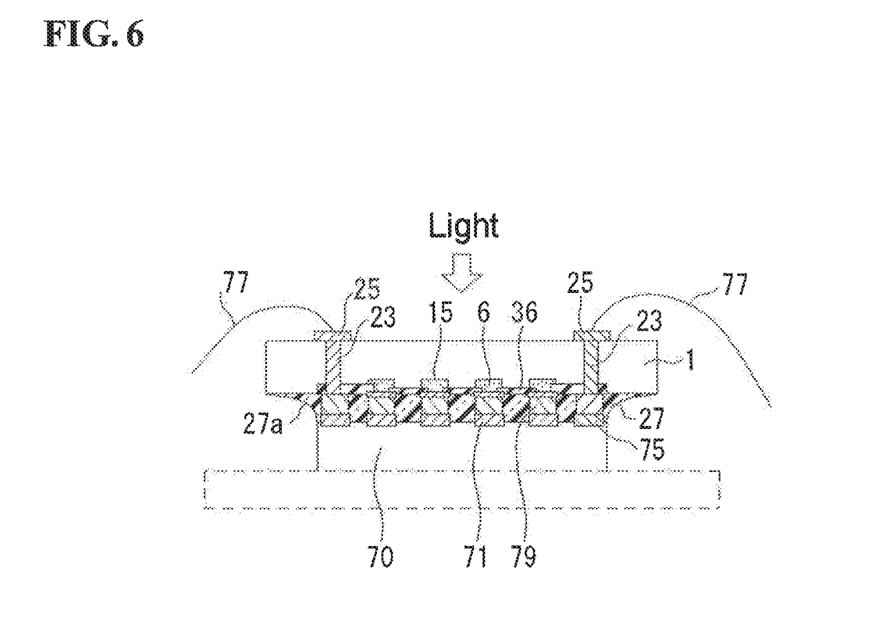
FIG. 6 illustrates another modification of the optical sensor apparatus illustrated in FIG. 4.

FIG. 6 illustrates another embodiment of the present invention. That is, a modification of the optical sensor apparatus of FIG. 4 is illustrated in FIG. 6. The relay board 50 may not be provided in FIG. 6. In the optical sensor apparatus illustrated in FIG. 6, the pad electrodes 25 on the incidence surface of the sensor chip 10 are directly wire-bonded to the connection pins (not shown). There may be the relay board 50, but not providing the relay board 50 is more economical.

Example

Figure 7:
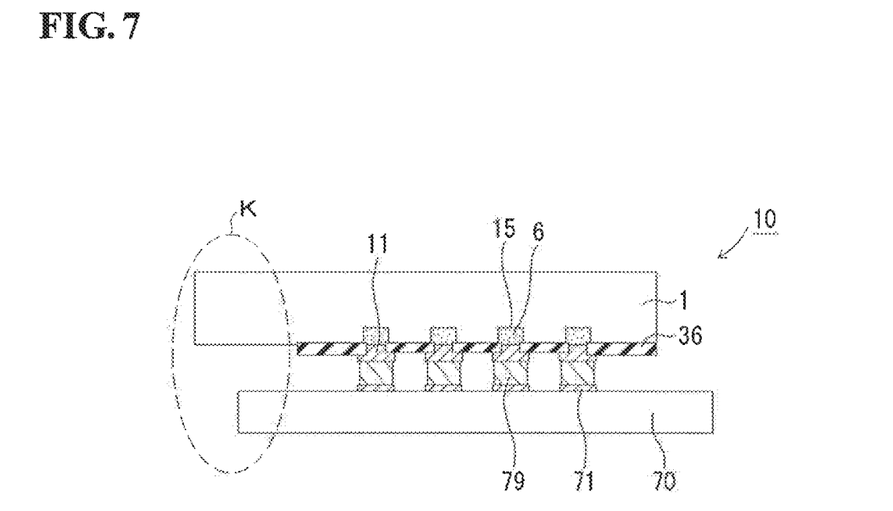
FIG. 7 illustrates a test piece A1 in Example.
Figure 8:
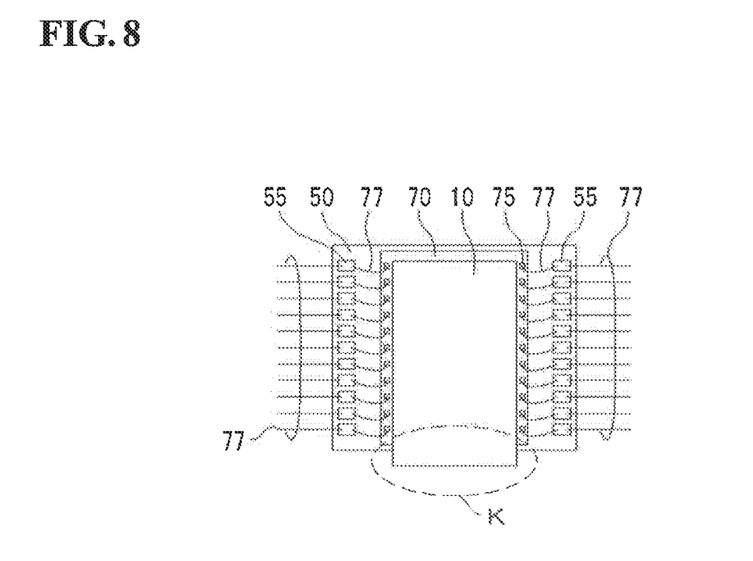
FIG. 8 is a plan view of the test piece A1 illustrated in FIG. 7.

A test piece A1 according to part of the present invention and a test piece B1 of a comparative example were prototyped to evaluate nonuniformity of light intensity in an image. FIGS. 7 and 8 illustrate the sensor chip 10, the read-out circuit 70, and other components of the test piece A1. In the test piece A1, a substrate 1 of the sensor chip 10 is elongated on a short side of the read-out circuit 70 (indicated by an oval K drawn in a broken line) where the external connection terminals 75 are not arranged. The sensor chip 10 hides the read-out circuit 70 in plan view. Utile sensor chip 10 is configured to hide long sides of the read-out circuit 70 having a rectangular shape, wire bonding to the external connection terminals 75 cannot be made. Therefore, a short side of the rectangular read-out circuit 70 is hidden in the test piece A1. In Example, the test piece A1 was used as an optical sensor apparatus to verify the advantageous effect of the present invention. To verify uniformity of light intensity on the screen in operation, the test piece A1 needs to be one that corresponds to the optical sensor apparatus having the electrical connection structure in the read-out circuit 70 and the relay board 50. In other words, a sensor chip and a read-out circuit of the optical sensor apparatus and external control devices are all required to operate in the switched-on state. To produce the optical sensor apparatus and turn it into the switched-on state, products equivalent to the read-out circuit 70 and the relay board 50 included in the optical sensor apparatus need to be prepared. For example, to realize the electrical connection structure illustrated in FIG. 2 or 4, a product equivalent to the read-out circuit 70 or the sensor chip 10 illustrated in FIG. 2 or 4 needs to be obtained. Modifying the electrical connection structure of the product equivalent to the read-out circuit 70 or the sensor chip 10 involves considerable cost and time. It is not appropriate to take such significant cost and effort to verify the effectiveness of the invention before actual production. Therefore, as the second best solution, the test piece A1 was used, in which a conventional electrical connection structure was used without change and the embodiments of the present invention were only partially implemented.

Figure 9:
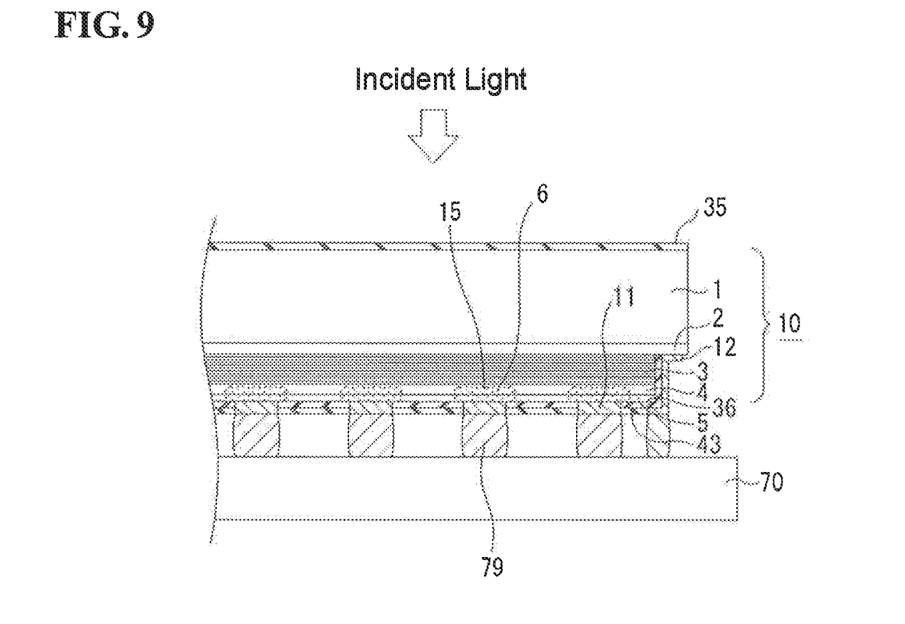
FIG. 9 illustrates the sensor chip and the read-out circuit in the test piece A1.

FIG. 9 illustrates the sensor chip 10 and the read-out circuit 70 used in the test piece A1. A right end portion of the read-out circuit 70 is not hidden from view by the sensor chip 10, because this is not the side indicated by the oval K in FIGS. 7 and 8.

The sensor chip 10 includes a type-II InGaAs/GaAsSb multi quantum well (MQW) structure formed on an InP substrate as an optical absorption layer. Specifically, the sensor chip 10 has a stacked layer structure including an InP substrate 1, a buffer layer 2, an optical absorption layer 3 having a type-II (InGaAs/GaAsSb) multi quantum well structure, an InGaAs Zn-impurity concentration adjusting layer 4, and an InP window layer 5. A p-n junction 15 is formed at a front end of each p-type region 6 made by the diffusion of zinc (Zn) introduced through openings of a selective diffusion musk pattern 36 on a surface of the InP window layer 5. The selective diffusion mask pattern 36 is protected by a passivation layer 43. Pixels are mainly formed of p-type regions 6. Adjacent pixels are separated by a non-diffusion region and thus are independent of each other. The sensor chip 10 is a so-called planar-type photodiode. The sensor chip 10 has a rectangular pixel region where 320 pixels are arranged along a long side and 256 pixels are arranged along a short side. An AR coating 35 is formed on a back surface of the InP substrate 1 which is an incidence surface.

A multi quantum well (MQW) structure may include a type-II MQW structure made of (InGaAsN/GaAsSb), (InGaAsNP/GaAsSb), or (InGaAsNSb/GaAsSb). Examples of other semiconductors that may be used as the optical absorption layer include InGaAs, type-II GaSb/InAs MQW structure, HgCdTe, and InAsSb. To ensure independence of a plurality pixels, a planar-type light receiving device or a mesa-type light receiving device is used as the sensor chip. The planar-type light receiving device ensures independence of pixels by means of selective diffusion. The mesa-type light receiving device ensures independence of pixels by means of grooves.

Figure 10:
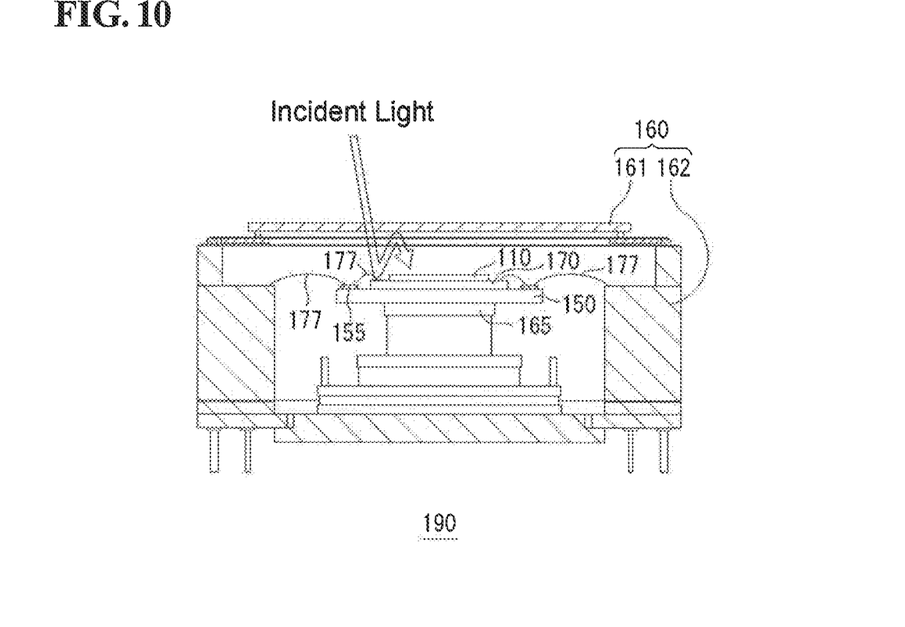
FIG. 10 illustrates a test piece B1 in Example.
Figure 11:
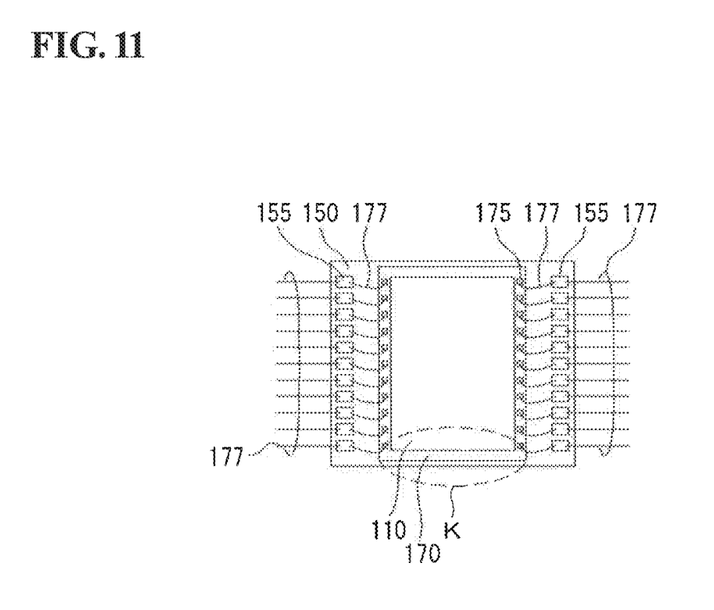
FIG. 11 is a plan view of the test piece B1 illustrated in FIG. 10.

A test piece B1 of the comparative example will now be described with reference to FIG. 10. In an optical sensor apparatus 190 serving as the test piece B1, as in the case of the optical sensor apparatus 90 illustrated in FIG. 1, a package 160 is composed of a window 161 made of sapphire and a package main body 162. A sensor chip 110 faces the window 161. A difference from the optical sensor apparatus 90 illustrated in FIG. 1 is that a read-out circuit 170 larger in both length and width is disposed under the sensor chip 110. In other words, in plan view, the sensor chip 110 is fully included in an area occupied by the read-out circuit 170. The other structures are the same as those of the test piece A1. A relay board 150 is disposed under the read-out circuit 170. A Peltier device 165 is disposed under the relay board 150. Referring to FIG. 11 as well as FIG. 10, read-out electrodes 175 on the read-out circuit 170 are connected by wires 177 to interconnection electrodes 155 on the relay board 150. The interconnection electrodes 155 are also wire-bonded to connection pins (not shown). The sensor chip 110 and the read-out circuit 170 in the test piece B1 are the same as those in FIG. 9, except that the read-out circuit 170 extends off the sensor chip 110 on a short side (see FIG. 11) surrounded by an oval K drawn in a broken line.

Figure 12:
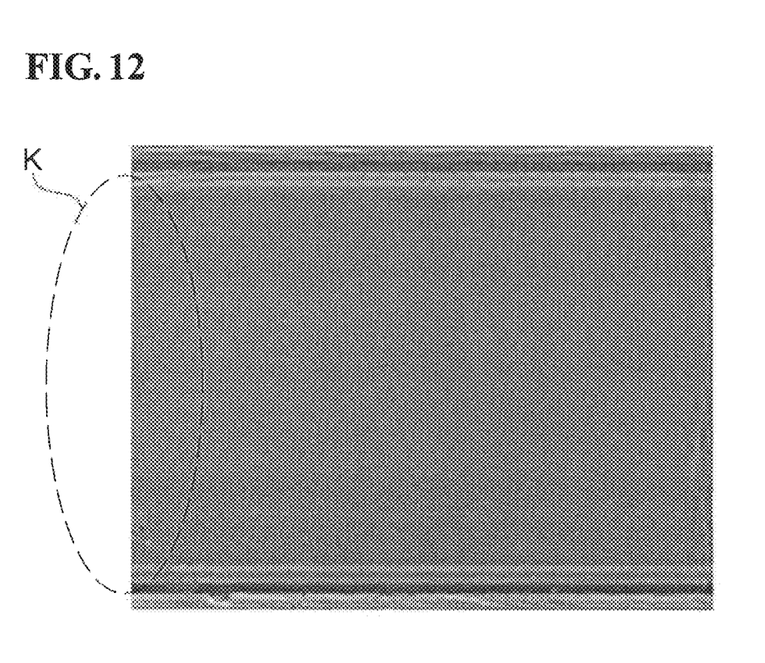
FIG. 12 illustrates an image for the test piece A1 (example of the present invention).
Figure 13:
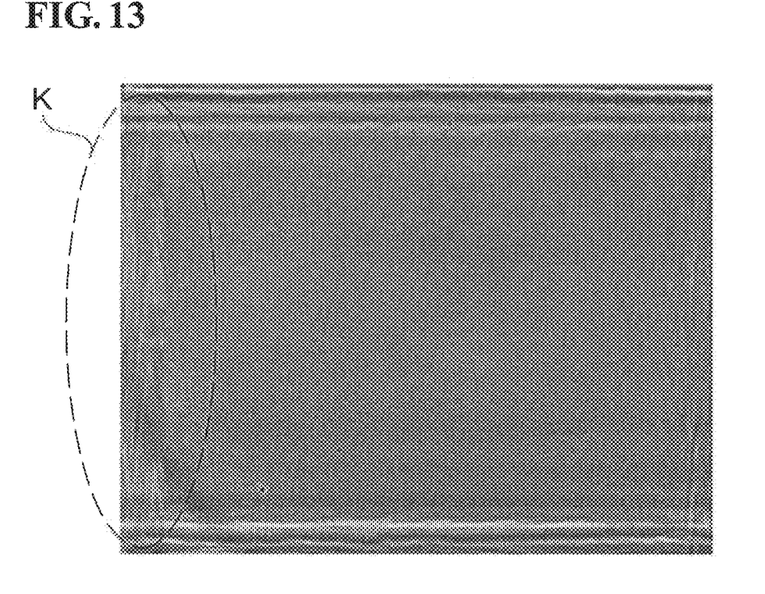
FIG. 13 illustrates an image for the test piece B1 (comparative example).

For each of the test pieces A1 and B1, light of a halogen lamp was applied to a white flat plate and the reflected light was made incident on the window of the optical sensor apparatus, with the sensor chip, the read-out circuit, and external control devices being in the switched-on state. The resulting image was printed out to obtain a light intensity distribution. The result for the test piece A1 is shown in FIG. 12 and the result for the test piece B1 is shown in FIG. 13. As described for the test piece A1, the uniformity of light intensity along a short side (region indicated by the oval K) of the image surface is examined with reference to FIGS. 12 and 13. As illustrated in FIG. 13, in the test piece B1, undulations of light and dark appear and the light intensity is nonuniform along the short side in the area indicated by the oval K. In contrast, FIG. 12 shows that the light intensity in and near the oval K is uniform. FIG. 12 also shows that in an area near the other short side (not indicated by the oval K) opposite the oval K, the light intensity is nonuniform as in the test piece B1. This reveals that the nonuniform light intensity distribution on the image surface is caused by the read-out circuit extending off the sensor chip. In the test piece B1, the light intensity distribution is nonuniform along all four sides of the image surface. This is because light reflected from the read-out circuit 170 extending off the sensor chip 110, as in FIG. 10, is further reflected by the back surface of the window 161 and returns to the sensor chip 110. In the test piece A1 of Example, the sensor chip 10 extends, only in the short side area indicated by the oval K, to hide the read-out circuit 70. FIG. 12 shows that this can eliminate the nonuniformity of light intensity on the image surface. Therefore, when the read-out circuit is hidden by the sensor chip in plan view and does not extend off the sensor chip on any of the four sides, the light intensity on the image surface is uniform and the nonuniformity disappears.

The optical sensor apparatus according to any of the embodiments described above is applicable, for example, to a spectral imaging system. When an object to be imaged (analyzed) contains a plurality of substances, the substances normally have different absorption spectral bands. In this case, for example, by dividing light to be incident on the sensor chip into wavelength bands, the distribution and concentration of each substance in the object can be detected by one-dimensionally or two-dimensionally measuring light reflected from the object for each wavelength band. The spectral imaging system including the optical sensor apparatus described above makes it possible to obtain images for different wavelength bands.

The present invention is not limited to specific configurations disclosed in the embodiments.

What is claimed is:

1. An optical sensor apparatus comprising:
   a package having a window;
   a sensor chip having an array of light receiving devices and a pixel electrode connected to each light receiving device, the sensor chip having an incidence surface that faces the window of the package; and
   a read-out circuit disposed under the sensor chip, the read-out circuit having a read-out electrode electrically connected to each pixel electrode of the sensor chip,
   wherein the sensor chip and the read-out circuit are housed in the package, and
   wherein, in plan view from the sensor chip;
      the read-out circuit is overlapped by the sensor chip, and
      the read-out circuit has no portion extending off the sensor chip.

2. The optical sensor apparatus according to claim 1, wherein each pixel electrode of the sensor chip and each read-out electrode of the read-out circuit are electrically connected by flip-chip connection to each other through a bump.

3. The optical sensor apparatus according to claim 2, further comprising an underfill resin filled in a space between the bumps interposed between the pixel electrodes of the sensor chip and the read-out electrodes of the read-out circuit,
   wherein the underfill resin has an outer periphery extending outward from the read-out circuit to the sensor chip in a skirt-like manner.

4. The optical sensor apparatus according to claim 1, further comprising a relay board under the read-out circuit, the relay board having an interconnection electrode, wherein
   the read-out circuit has an external connection terminal on a surface thereof and a via hole directly below the external connection terminal,
   the external connection terminal is connected to one of the read-out electrodes of the read-out circuit, the via hole is filled with a conductive material, the relay board has, in plan view from the sensor chip, a region overlapped by the read-out circuit and a region extending off the sensor chip, the interconnection electrode extends from the region overlapped by the read-out circuit to the region extending off the sensor chip; and the external connection terminal and the interconnection electrode are electrically connected through the conductive material in the via hole of the read-out circuit.

5. The optical sensor apparatus according to claim 4, wherein the package includes a package main body having a connection pin, and the interconnection electrode of the relay board is electrically connected to the connection pin of the package main body.

6. The optical sensor apparatus according to claim 1, wherein the read-out circuit has an external connection terminal on a surface thereof, the external connection terminal is connected to one of the read-out electrodes of the read-out circuit, the sensor chip has a through-hole filled with a conductive material, and a pad electrode on the incidence surface opposite to a surface on which one of the pixel electrodes is formed, and the external connection terminal and the pad electrode are electrically connected through the conductive material filled in the through-hole.

7. The optical sensor apparatus according to claim 6, further comprising a relay board under the read-out circuit, the relay board having an interconnection electrode in a region extending off the sensor chip in plan view from the sensor chip, wherein the interconnection electrode of the relay board is electrically connected to the pad electrode through a wire.

8. The optical sensor apparatus according to claim 6, wherein the package includes a package main body having a connection pin, and the pad electrode on the incidence surface of the sensor chip is electrically connected to the connection pin of the package main body through a wire.

9. The optical sensor apparatus according to claim 1, wherein the read-out circuit has an external connection terminal on a surface thereof, the external connection terminal is connected to one of the read-out electrodes of the read-out circuit, the sensor chip has a wiring pattern and a pad electrode on the incidence surface opposite to a surface on which one of the pixel electrodes is formed, the wiring pattern is formed along an outer periphery of the sensor chip on the incidence surface, a side surface, and the surface on which said one of the pixel electrodes is formed, and the external connection terminal and the pad electrode are electrically connected through the wiring pattern.

10. The optical sensor apparatus according to claim 9, further comprising a relay board under the read-out circuit, the relay board having an interconnection electrode in a region extending off the sensor chip in plan view from the sensor chip, wherein the interconnection electrode of the relay board is electrically connected to the pad electrode through a wire.

* * * * *